United States Patent [19]

Engler et al.

[11] 4,088,944
[45] May 9, 1978

[54] NMR SPECTROMETER EMPLOYING SELF CENTERING TURBINE

[75] Inventors: Clifford G. Engler, Redwood City; Joseph J. Sipirora, Campbell, both of Calif.

[73] Assignee: Varian Associates, Inc., Palo Alto, Calif.

[21] Appl. No.: 729,048

[22] Filed: Oct. 4, 1976

[51] Int. Cl.² ............................................. G01R 33/08
[52] U.S. Cl. ............................... 324/.5 AH; 324/.5 A
[58] Field of Search ................ 324/.5 R, .5 A, .5 AC, 324/.5 AH

[56] References Cited

U.S. PATENT DOCUMENTS

| 3,681,683 | 8/1972 | Huber | 324/.5 AH |
| 3,911,355 | 10/1975 | Leane | 324/.5 A |

*Primary Examiner*—Rudolph V. Rolinec
*Assistant Examiner*—Michael J. Tokar
*Attorney, Agent, or Firm*—Stanley Z. Cole; Gerald M. Fisher; Edward H. Berkowitz

[57] ABSTRACT

A gyromagnetic resonance spectrometer employing a spinning sample in a magnetic field, the spinning sample being affixed to a gas driven turbine which is supported by a gas bearing. Means are provided for firmly holding and centering the sample at more than one axial position thereby aligning the sample tube with the turbine axis irrespective of variations in sample tube diameter and straightness.

9 Claims, 7 Drawing Figures

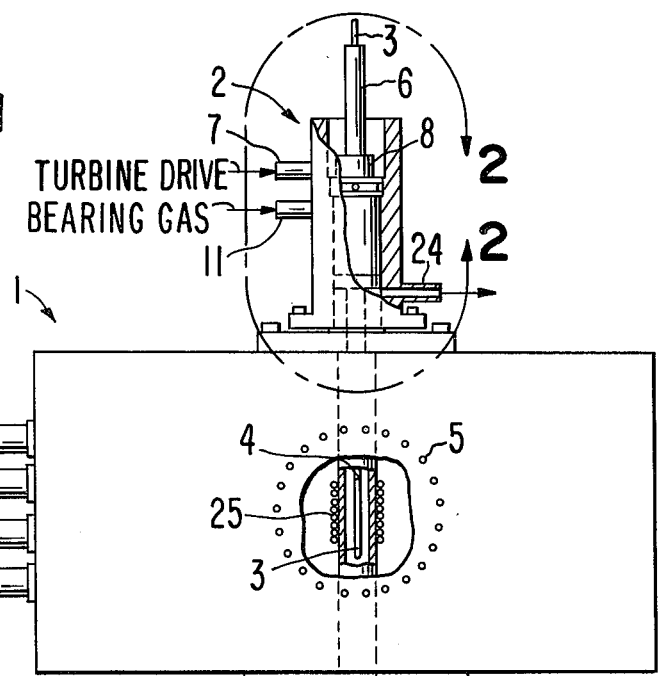
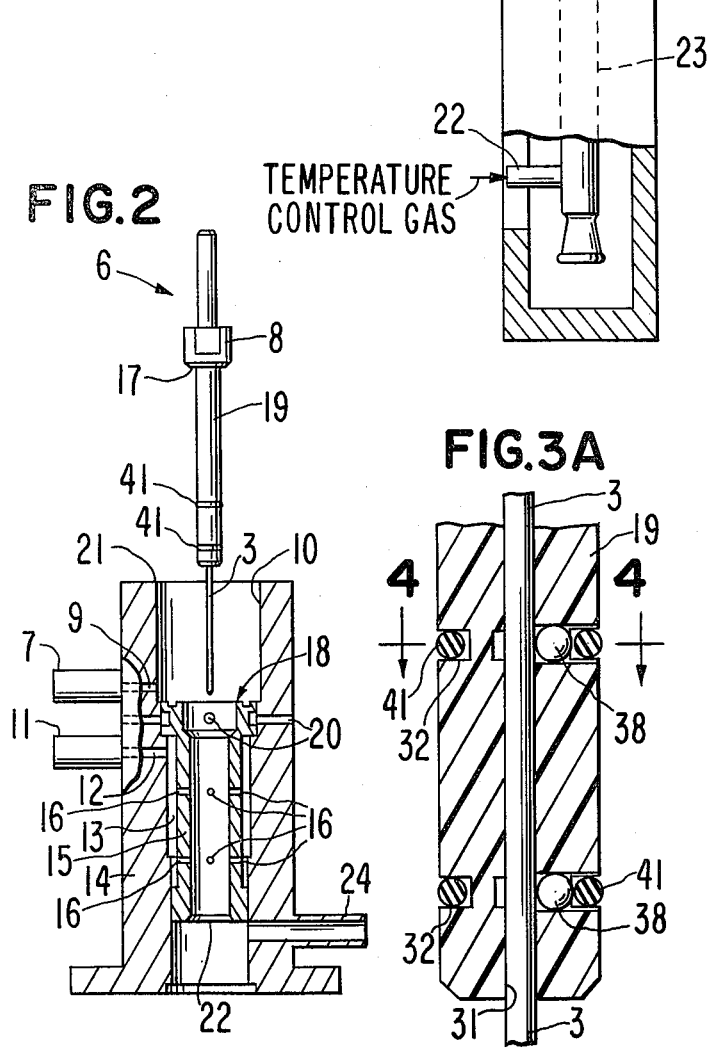
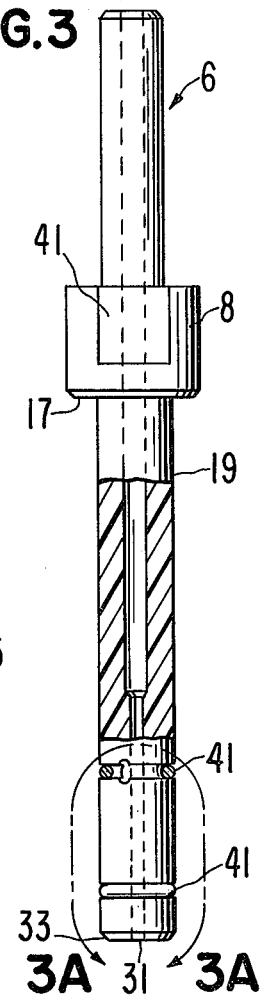

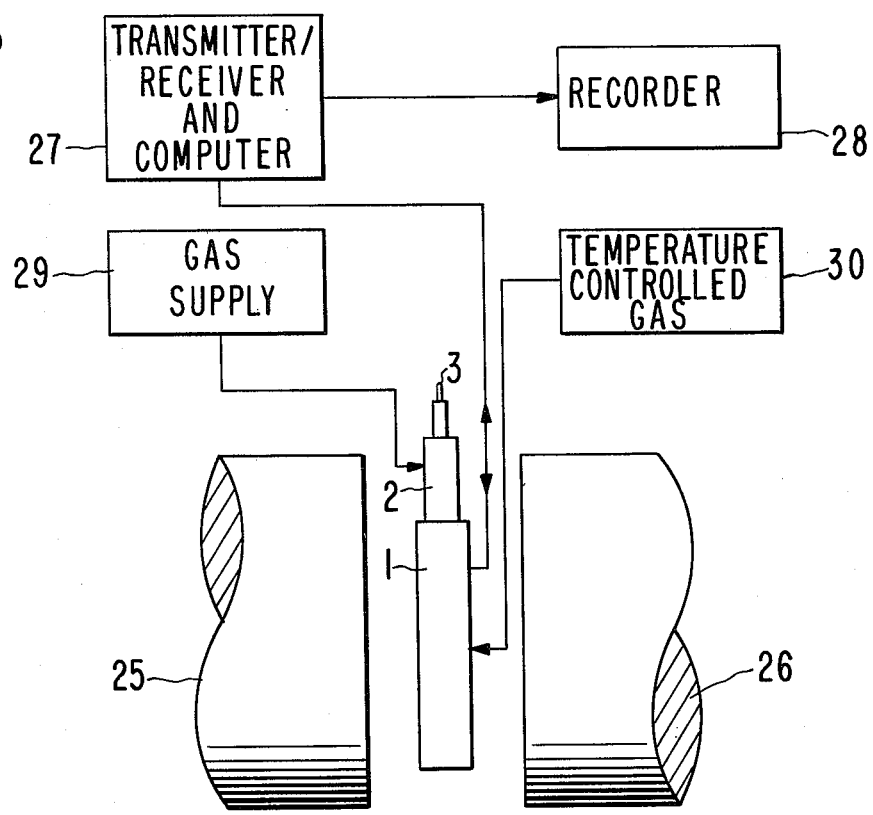
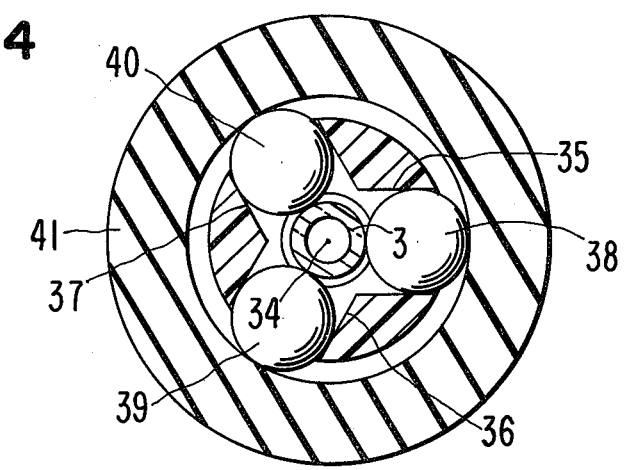

NMR SPECTROMETER EMPLOYING SELF CENTERING TURBINE

BACKGROUND OF THE INVENTION

Gas driven turbines have been employed previously for holding the samples to be investigated in the high intensity unidirectional magnetic field of a nuclear magnetic resonance spectrometer while at the same time rapidly spinning the sample tube about its axis. Spinning of the sample averages out the effects of inhomogeneity in the polarizing magnetic field, enabling improvement in the resolution of the resonance lines of the spectrum. The spinning sample technique is disclosed in U.S. Pat. No. 2,960,649 issued Nov. 15, 1960.

Heretofore turbines for the smaller diameter sample spinners took the form of elongated cylindrical members having an axial bore therethrough which bore was provided with slotted extensions at its top or bottom end. At some location in the bore, its diameter was made to be slightly smaller than the outside diameter of a sample tube to be inserted, therein enabling an inwardly acting force upon the sample tube upon insertion. The alignment of the sample tube to the axis of the turbine was thereby determined by the bore and concentricity of the bore. Since the axial bore has to be large enough to receive the expected tolerance in sample tube sizes, normally the tubes would be grasped by the turbine at only one location, resulting in a wobble of the sample tube upon spinning. With very small amounts of sample and hence low level signal, this instrumentation artifact was particularly undesirable. In order to assure concentricity of the inner bore, expensive machining of the turbines was required since it is difficult to maintain concentricity of a small bore over a long length.

SUMMARY OF THE PRESENT INVENTION

The object of the invention is to provide an improved NMR spectrometer by reducing wobble in the axis of a spinning sample.

A further object is to provide an improved turbine for a sample spinner which will simply and conveniently assure alignment of the sample tube axis with the turbine spin axis.

A further object is to provide an improved NMR spectrometer as above which will accept sample tubes the diameter of which vary from end to end and which have variations in their straightness.

A still further object is to provide a turbine particularly well suited for extremely small sample tubes as of 1.7 mm.

DESCRIPTION OF THE DRAWINGS

FIG. 1 is a cross-section of an NMR probe including a sample spinner.

FIG. 2 is a cross-sectional view of a sample spinner including a stator and a turbine in position for installation into the stator.

FIG. 3 is a cross-sectional view of the turbine of this invention.

FIG. 3A is an exploded view of the centering and holding means on the turbine.

FIG. 3B is the prior art turbine sample tube holding means.

FIG. 4 is a cross-sectional view through one portion of the holding means of the invention.

FIG. 5 is a block diagram of a nuclear magnetic resonance spectrometer system which utilizes the improved spinner apparatus of the present invention.

DESCRIPTION OF THE PREFERRED EMBODIMENT

Referring now to FIG. 1 there is shown the probe 1 including a sample spinner 2 for holding and spinning a sample tube 3 so that the end of the sample tube containing a sample 4 can be placed at the center of the magnetic field and at the location of the transmitter/receiver coils 25 of the probe 1. The probe is immersed in a high dc magnetic field 5 and is aligned so that the spin axis of the turbine 6 is normal to the direction of the magnetic field line 5. A gas source is provided under pressure to conduit 7 which extends through the housing of the spinner 2 to impinge upon the edge of the turbine 6 at its enlarged dimension 8. This gas is provided through a very small hole 9 (FIG. 2) as of 0.018 inches, in the stator housing at an angle almost tangent to the inner bore of the housing 10. Thus, the pressurized gas exits at a very high velocity from hole 9 and drives the turbine by impinging thereon tangentially at a distance from the turbine axis. A second gas source provides gas under pressure which enters through conduit 11 into a space 13 between spinner housing wall 14 and inner bearing 15. Inner bearing 15 contains a plurality of holes 16 around its periphery for ingress of gas which serves to raise and maintain the bottom 17 of the enlarged section of the turbine 6 raised up from the upper surface of the air bearing 18 and also to maintain the sides of the turbine "floating" on the gas away from the walls of the bearing 15, walls of the spinner housing 10 and the top 18 of the air bearing. The gas can escape through the apertures 20 which extend through the outer housing 12 and the bearing walls 15, as well as out of the top 21 of the spinner housing and the bottom 22 of the bearing.

The probe 1 includes a further inlet 22 for temperature controlling gases which flow upwardly through the tube 23 past the sample and out orifice 24 in the sample housing. Mounted on tube 23 are the transmitter and receiver coil 25. With reference to FIG. 5, the probe 1 is shown between the pole pieces 25 and 26 of a uni-directional magnet. The rf energy in a pulse spectrometer is supplied from the transmitter 27 and fed to transmitter/receiver coil 25 in the probe 1. The induced resonance signals are picked up in the receiver coil when the pulse terminates, and are fed back to the receiver where the response is converted from the time to frequency domain and thence displayed on the recorder 28. Gas supply 29 provides the pressure and fluid source to spin the turbine holding the sample tube 3 and to sustain the air bearing. For experiments requiring temperature control of the sample, the probe is connected to a source of temperature controlled gas 30.

The sample spinning turbine 6 is particularly suited for holding very small tubes, as of 1.7 mm sample tube. Turbine 6 of this invention comprises a generally cylindrical member 19 of any non-magnetic material as of Delrin, Teflon or Nylon having an axial bore 31 therethrough. With references to FIGS. 3, FIG. 3A and FIG. 4, novel means for retaining the sample tube in the turbine are disclosed. Two axially displaced grooves 32 are in the outer turbine wall 19 near the lower end 33 of the turbine. In these grooves 32, three bores, 35, 36, 37 intersecting the axis 34 of the turbine are drilled 120° displaced. In each of these bores are located a non-magnetic ball, 38, 39, 40, as of plastics, Nylon, and sapphire or the like which is dimensioned to freely move in and out in their bores. A rubber "O" ring 41 is slipped onto the turbine and into the grooves 32 constraining the radially outward movement of the balls in the bores. When the sample tube 3 is placed into the axial bore 31, the insertion and holding force on the sample tube is determined by the elasticity of the "O" ring 41. The self-centering action of the 120° displaced balls will always align the axis of sample tube 3 with the turbine axis 34. The elasticity of the "O" rings will permit the turbine to accept tubes of different sizes while still maintaining the alignment of the axis of rotation of the sample tube over widely varying temperatures, as of 0° Centigrade to +120° Centigrade. Additionally, sample tubes having different diameters over their length are also automatically aligned with the axis of the turbine by this holding arrangement. Slight variations in the straightness of the sample tubes are also accommodated by this configuration while at the same time permitting adjustment of the sample tube along this axis. Frequently the turbine is provided with a mark or flat reflectorized surface 46 at some location on its periphery which mark or flat surface cooperates with a speed measuring tachometer (not shown).

The prior art fastening technique for a 1.7 mm ± 0.1mm O.D. sample tubes is depicted in FIG. 3B. In this prior art the end of the turbine was slotted in the axial direction of the turbine so that there were formed a plurality of axial fingers 42 and 43. The alignment of the sample tube was determined by the bore and the concentricity of the axial bore 43 which inner diameter decreased toward the end 44. Since the diameter had to be large enough to accept the largest sample tube, as of 1.8 mm, the slotted extensions would normally grip the sample tube at only one location 44, permitting the sample tube to wobble about its axis when spinning. Rubber "0" rings 45 were used to provide the insertion and holding force. In addition to these operational problems with the prior art turbines, for these very small diameter sample tubes such as 1.7 mm it was very expensive to manufacture a turbine having the necessary concentricity of the axial bore over the long length of the turbine. In order to prevent breakage of the extremely fragile small sample tubes, the insertion force must be low. Since the "0" rings establish this force, and since the balls 38-40 are dimensioned to be equally restrained by the "0" ring when the sample tube is inserted, the insertion force is evenly applied from each ball perpendicularly to the axis of the thin-walled tube of the sample to permit ease of insertion and removal and to provide adequate holding force at speeds up to 50 rps without the danger of sample tube breakage. In the above described preferred embodiments, the sample holding dimensions of the turbine are substantially less critical than in the prior art such that the turbine can be made by standard plastic molding techniques with a minimum amount of high tolerance machining.

We claim:

1. In a gyromagnetic resonance spectrometer apparatus, probe means for holding a sample tube in a undirectional field,
   means for exciting and detecting gyromagnetic resonance of samples in said unidirectional field,
   a sample spinner apparatus for rotating the sample within said unidirectional field, said sample spinner having a turbine which floats on and is turned by fluid under pressure, THE IMPROVEMENT COMPRISING said turbine being an elongated cylindrically shaped member having an axial bore at least partially therethrough to receive said sample tube.
   means for attaching said sample tube to said turbine at a plurality of discrete locations, such that said sample tube axis is aligned with the axis of said turbine, said plurality of discrete locations including locations displaced in a longitudinal direction determined by the direction of the axis of said turbine.

2. The apparatus of claim 1 wherein said means for attaching includes three balls constrained to contact the outer wall of said sample tube along lines which are 120° displaced about the axis of said sample tube.

3. The apparatus of claim 2 wherein said balls are constrained by azimuthal bores displaced angularly from one another by 120° about said axis and wherein said balls are constrained radially by an elastomeric member around the periphery of said turbine and over the face wherein the said 120° bores intersect said outer periphery of said turbine.

4. In a gyromagnetic resonance spectrometer apparatus, probe means for holding a sample tube in a unidirectional field,
   means for exciting and detecting gyromagnetic resonance of samples in said unidirectional field,
   a sample spinner apparatus for rotating the sample within said unidirectional field, said sample spinner having a turbine which floats on and is turned by fluid under pressure, THE IMPROVEMENT COMPRISING said turbine being an elongated cylindrically shaped member having an axial bore at least partially therethrough to receive said sample tube ,
   means for attaching said sample tube to said turbine such that said sample tube axis is aligned with the axis of said turbine, said means for attaching including three balls constrained to contact the outer wall of said sample tube along lines which are 120 degrees displaced about the axis of said sample tube.

5. Spin apparatus for a gyromagnetic spectrometer sample holder comprising,
   a turbine assembly being a cylindrical member having an upper cylindrical length of larger diameter than its lower cylindrical length so as to form a peripheral lip for cooperating with a stator gas bearing member to support said turbine, said lower cylindrical member having an axial bore at least partially therethrough for receiving a sample tube,
   means for centering and attaching a sample tube to said turbine at a plurality of discrete locations, said locations including locations displaced in a longitudinal direction determined by the direction of the axis of the turbine.

6. The turbine of claim 5 wherein said means for centering and attaching includes three balls constrained to contact a sample tube along lines which are 120° displaced about the axis of said turbine.

7. The turbine of claim 6 wherein said balls are constrained to move in three bores which intersect the axis of said turbine at 120°.

8. The turbine of claim 7 wherein said balls are further constrained radially by an elastomeric member which surrounds the periphery of said turbine.

9. The turbine of claim 8 wherein said elastomeric member is seated in a groove in said periphery.

* * * * *